United States Patent [19]

Meitzler

[11] Patent Number: 4,686,406

[45] Date of Patent: Aug. 11, 1987

[54] APPARATUS FOR APPLYING HIGH FREQUENCY ULTRASONIC ENERGY TO CLEANING AND ETCHING SOLUTIONS

[75] Inventor: Allen H. Meitzler, Ann Arbor, Mich.

[73] Assignee: Ford Motor Company, Dearborn, Mich.

[21] Appl. No.: 927,625

[22] Filed: Nov. 6, 1986

[51] Int. Cl.⁴ .................. H01L 41/08

[52] U.S. Cl. .................. 310/322; 310/323; 310/334; 366/127; 134/1

[58] Field of Search .................. 310/26, 322, 323, 325, 310/334, 337; 134/1, 184, 192; 366/113, 117, 118, 120, 121, 127, 600

[56] References Cited

U.S. PATENT DOCUMENTS

| | | | |
|---|---|---|---|
| 3,198,489 | 8/1965 | Finch | 310/334 X |
| 3,240,963 | 3/1966 | Sasaki | 310/328 X |
| 4,401,131 | 8/1983 | Lawson | 134/149 |
| 4,537,511 | 8/1985 | Frei | 310/323 X |
| 4,602,184 | 7/1986 | Meitzler | 310/322 |

*Primary Examiner*—Mark O. Budd

*Attorney, Agent, or Firm*—Paul K. Godwin, Jr.; Clifford L. Sadler

[57] ABSTRACT

An improved apparatus for coupling ultrasonic energy from piezoelectric transducers to a liquid medium for use in cleaning or etching processes. The apparatus includes a vibration coupling plate which may be partially immersed in the liquid medium, while the upper, nonimmersed end of the plate is configured to support a pair of piezoelectric transducers disposed at 45 degree angles with respect to the lengthwise axis of the plate. The beams of ultrasonic mechanical wave energy are therefore reflected back and forth from the side edges of the plate and dispersed over a wider angle in the liquid.

6 Claims, 1 Drawing Figure

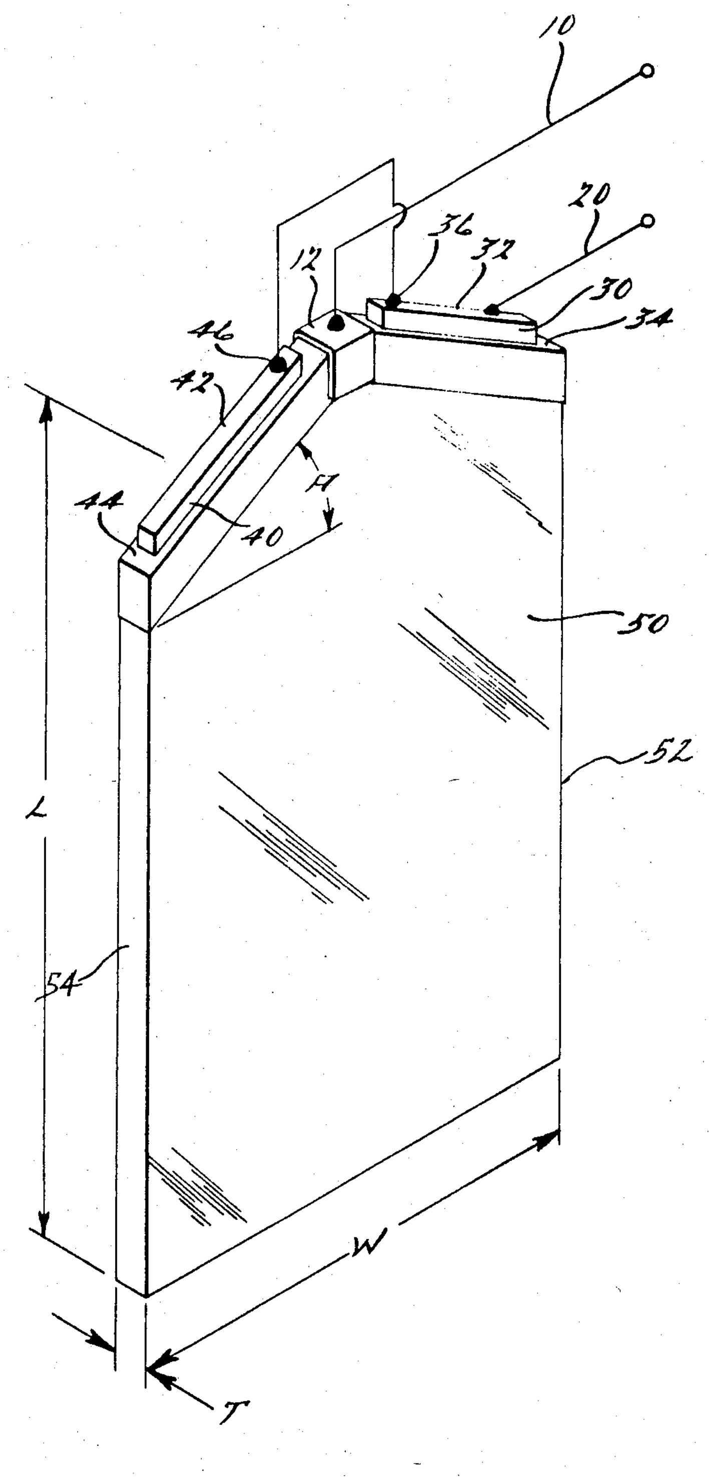
10
20
36
32
30
34
12
46
42
44
40
A
50
52
L
54
W
T

APPARATUS FOR APPLYING HIGH FREQUENCY ULTRASONIC ENERGY TO CLEANING AND ETCHING SOLUTIONS

BACKGROUND OF THE INVENTION

1. Field of the Invention

The present invention is directed to the field of surface cleaning and etching of silicon substrates and more specifically to an improved apparatus for enhancing those processes.

2. Description of the Prior Art

The use of ultrasonic energy to generate cavitation in cleaning solutions and thereby enhance cleaning action is a common, well established practice and is described in U.S. Pat. Nos. 3,198,489; 3,240,963; and 4,401,131.

A more recent innovation in this area is my earlier invention described in U.S. Pat. No. 4,602,184, which is incorporated herein by reference.

SUMMARY OF THE INVENTION

While the main purpose of my earlier invention (referenced above) was to provide a glass plate coupling device that would allow high frequency energy to be conveyed to a liquid medium from a piezoelectric transducer bonded to the nonimmersed end of the plate, the present invention is intended as an improvement to that transducer/plate assembly.

The improvement results from forming the upper end of the glass plate to have a pair of edges that are each disposed at an approximate 45° angle to the length axis of the plate. A piezoelectric transducer is bonded to each angled edge and upon being energized with a high frequency electrical signal, each transducer produces a beam of high frequency vibration that is transmitted in the plate in a direction of 45° to the length axis and reflected back and forth between the side edges of the plate.

It is an object of the present invention to provide an improved ultrasonic transducer and low-loss coupler apparatus that efficiently produces low micron sized cavitation in a liquid medium. It is another object of the present invention to provide an improved apparatus that makes it possible to apply megahertz induced cavitation to either a cleaning or an etching process.

It is still another object of the present invention to increase the coverage area of vibrational wave energy, causing cavitation in the liquid medium, while maintaining isolation of the actual transducers from the liquid.

BRIEF DESCRIPTION OF THE DRAWING

The FIGURE illustrates the preferred embodiment of the present invention.

DETAILED DESCRIPTION OF THE PREFERRED EMBODIMENT

In my earlier referenced patent, the apparatus employed for applying high frequency mechanical vibration energy into a liquid medium utilized a piezoelectric transducer bonded to the upper edge of a generally rectangular glass plate. By applying high frequency electrical energy to the opposing electrodes of the piezoelectric transducer, mechanical shear waves were produced in the glass plate which traveled parallel to the length of the plate and communicated mechanical wave energy to the liquid medium in which it was immersed.

With the present invention, I have been able to increase the length of path in which the mechanical vibrational energy beam from each transducer is present in the transmitting glass plate and thereby increase the amount of power that was able to be conveyed into the liquid medium and enhance the cavitational action in the liquid.

The FIGURE illustrates the glass plate 50 of the same material as that disclosed in my earlier referenced patent and being of a generally rectangular shape having a width "W" across its major surface and a length "L" dimension running parallel to the side edges 52 and 54. However, the upper end of the plate 50 is formed to have a pair of upper edges respectively angled from the side edges 52 and 54 at an angle "A" that is approximately equal to 45°. On the upper edge associated with side edge 52, and electrical conducting electrode 34 is bonded thereto. Similarly, an electrical conductor 44 is bonded to the upper sloped edge adjacent to the side edge 54. Piezoelectric transducers 30 and 40 are respectively bonded to the electrical conductors 34 and 44 and have electrical conductors 32 and 42 respectively deposited on their upper surfaces opposite to elec trodes 34 and 44. Electrodes 32 and 42 are shown as being commonly connected through terminals 36 and 46 to a lead wire 20. Electrical conductors 34 and 44 are shown as being commonly connected through a terminal 12 to an electrical wire 10. Wires 10 and 20 are symbolized to receive the high frequency electrical signals on the order of 1 MHz from a source as described in my earlier referenced patent.

By inclining the upper transducer faces of the glass plate 50, with respect to the length dimension and parallel side edges 52 and 54, the length of path of the longitudinal wave motion propagated through the glass plate from the transducer surfaces is lengthened due to the fact that the wave energy will be reflected back and forth from the side edges of the plate 50. The use of the 45° angle was determined to avoid a phenomenon known as mode conversion. Since it is desirable to keep as much of the mechanical energy as possible carried by the wave motion in the lowest propagating longitudinal mode, it is desired to avoid mode conversion. The actual longitudinal wave motion in the present invention is composed of two component shear wave motions. Two beams of longitudinal wave motions are produced by the two transducers, each angled at 45° with respect to the side edges of the plate in order to avoid undersirable effects of mode conversion which arise when the longitudinal wave motions in the two beams are incident on the edge faces at an angle other than 45°. Thus, the intrinsic properties of the wave motion in this embodiment permit the beam pattern to be folded back and forth across the width "W" of the plate 50. As in my earlier referenced patent, it has been found to be most desirable to have the length of the transducers each at least ten times the thickness "T" of the plate in order to form a well-defined beam that is substantially parallel and nondispersive.

It will be apparent that many modifications and variations may be implemented without departing from the scope of the novel concept of this invention. Therefore, it is intended by the appended claims to cover all such modifications and variations which fall within the true spirit and scope of the invention.

I claim:

1. An improved apparatus for communicating high frequency mechanical energy into a liquid medium comprising:

transducer means formed by elongated piezoelectric material responsive to a high frequency electrical signal for generating a high frequency mechanical vibration and located external to said liquid medium;

means formed by a mechanically elastic material having the opposing planar surfaces, parallel side edges and pair of upper edges disposed at 45° angles to said side edges, with said transducer means bonded to its upper edges for transmitting said high frequency vibrations from said transducer means to said liquid medium.

2. An apparatus as in claim 1, wherein said high frequency signals is frequency modulated so as to prevent the occurrence of standing waves in said liquid medium.

3. An apparatus as in claim 1, wherein said high frequency is on the order of approximately 1 MHz.

4. An apparatus as in claim 3, wherein said transducer means comprises two separate piezoelectric transducers each containing a pair of continuous electrodes boned to opposite surfaces along their lengths, said upper edges of said transmitting means contain conductive coatings and one of said electrodes of each transducer is bonding to said conductive coatings on the respective upper edges.

5. An apparatus as in claim 4, wherein said high frequency electrical signal is applied across both transducers between the other of said respective electrodes and said conductive coating on said upper edges of said transmitting means.

6. An improved apparatus as in claim 1, wherein said transmitting means in a glass plate selected for transmitting longitudinal waves of mechanical vibration produced by said transducer means to a liquid medium, when immersed therein.

* * * * *